United States Patent
Lee

(10) Patent No.: US 11,171,671 B2
(45) Date of Patent: Nov. 9, 2021

(54) REDUCING VULNERABILITY WINDOW IN KEY VALUE STORAGE SERVER WITHOUT SACRIFICING USABLE CAPACITY

(71) Applicant: Samsung Electronics Co., Ltd., Suwon-si (KR)

(72) Inventor: Ronald C. Lee, Pleasanton, CA (US)

(73) Assignee: SAMSUNG ELECTRONICS CO., LTD.

(*) Notice: Subject to any disclaimer, the term of this patent is extended or adjusted under 35 U.S.C. 154(b) by 62 days.

(21) Appl. No.: 16/389,907

(22) Filed: Apr. 19, 2019

(65) Prior Publication Data

US 2020/0274556 A1 Aug. 27, 2020

Related U.S. Application Data

(60) Provisional application No. 62/810,373, filed on Feb. 25, 2019.

(51) Int. Cl.
*H03M 13/35* (2006.01)
*G06F 11/10* (2006.01)
(Continued)

(52) U.S. Cl.
CPC ....... *H03M 13/353* (2013.01); *G06F 11/1076* (2013.01); *H03M 13/154* (2013.01); *H03M 13/2906* (2013.01); *H03M 13/373* (2013.01)

(58) Field of Classification Search
CPC .......... H03M 13/353; H03M 13/2906; H03M 13/154; H03M 13/373; G06F 11/1076
(Continued)

(56) References Cited

U.S. PATENT DOCUMENTS

| | | | | |
|---|---|---|---|---|
| 5,542,065 A | * | 7/1996 | Burkes | G06F 3/0601 711/114 |
| 5,664,187 A | * | 9/1997 | Burkes | G06F 3/0601 707/999.2 |

(Continued)

OTHER PUBLICATIONS

R. Bhagwan, K. Tati, Y. Cheng, S. Savage and G. M. Voelker, "Total recall: System support for automated availability management," in Proc. of Symposium on Networked Systems Design and Implementation, 2004, pp. 1-14. (Year: 2004).*

*Primary Examiner* — John J Tabone, Jr.
(74) *Attorney, Agent, or Firm* — Renaissance IP Law Group LLP

(57) ABSTRACT

According to one general aspect, a system may include a data interface circuit configured to receive data access requests, wherein each data access request is associated with a data set. The system may include a plurality of storage devices each storage device configured to store data, and wherein the plurality of storage devices has an amount of available storage space, an amount of used storage space, and an amount of redundant storage space. The system may include a data management circuit configured to: monitor the amount of available storage space in the in the plurality of storage devices, determine, for one or more data set, a level of redundancy to be associated with the respective data set, generate, for a first data set of the data sets, a redundant data portion to be associated with the first data set, and dynamically adjust the level of redundancy associated with the first data set, based, at least in part, upon the amount of available storage space.

18 Claims, 8 Drawing Sheets

(51) Int. Cl.
*H03M 13/29* (2006.01)
*H03M 13/37* (2006.01)
*H03M 13/15* (2006.01)

(58) Field of Classification Search
USPC ........ 714/755, 762, 763, 768, 769, 773, 774
See application file for complete search history.

(56) References Cited

U.S. PATENT DOCUMENTS

| | | | | |
|---|---|---|---|---|
| 6,055,604 | A * | 4/2000 | Voigt | G11B 19/12 710/52 |
| 6,516,425 | B1 * | 2/2003 | Belhadj | G06F 11/1092 714/15 |
| 6,553,509 | B1 * | 4/2003 | Hanson | G06F 11/1471 707/E17.007 |
| 7,152,142 | B1 * | 12/2006 | Guha | G06F 3/0625 711/114 |
| 8,166,257 | B1 * | 4/2012 | Holl, II | G06F 13/28 711/154 |
| 8,239,584 | B1 * | 8/2012 | Rabe | G06F 3/0605 710/8 |
| 9,229,808 | B2 * | 1/2016 | Colgrove | G06F 11/1076 |
| 9,600,377 | B1 * | 3/2017 | Cohen | G06F 11/1453 |
| 9,727,414 | B2 * | 8/2017 | Cohen | G06F 11/1096 |
| 10,082,959 | B1 * | 9/2018 | Chen | G06F 3/061 |
| 10,185,624 | B2 * | 1/2019 | Akutsu | H04L 67/1097 |
| 10,255,137 | B1 * | 4/2019 | Panidis | G06F 11/1469 |
| 10,324,798 | B1 * | 6/2019 | Natanzon | G06F 11/2025 |
| 10,409,511 | B1 * | 9/2019 | Subbarao | G06F 3/067 |
| 10,437,783 | B1 * | 10/2019 | Cohen | G06F 11/1461 |
| 2002/0023225 | A1 * | 2/2002 | Lomnes | G06F 3/0623 726/30 |
| 2004/0068611 | A1 * | 4/2004 | Jacobson | G06F 3/0605 711/114 |
| 2004/0068636 | A1 * | 4/2004 | Jacobson | G06F 3/0689 711/203 |
| 2005/0102603 | A1 * | 5/2005 | Tapper | G06F 11/2094 714/770 |
| 2008/0275928 | A1 * | 11/2008 | Shuster | G06F 11/1076 |
| 2011/0125965 | A1 * | 5/2011 | Thomas | G06F 3/0676 711/114 |
| 2011/0202923 | A1 * | 8/2011 | Matsubayashi | G06F 9/4843 718/100 |
| 2011/0208933 | A1 * | 8/2011 | Selfin | G06F 11/1441 711/162 |
| 2011/0307745 | A1 * | 12/2011 | McCune | G06F 16/185 714/54 |
| 2012/0084505 | A1 * | 4/2012 | Colgrove | G06F 11/1076 711/114 |
| 2012/0265926 | A1 * | 10/2012 | Tal | G06F 11/108 711/103 |
| 2012/0317355 | A1 * | 12/2012 | Ishizaki | G06F 3/0653 711/114 |
| 2013/0073895 | A1 * | 3/2013 | Cohen | G06F 11/1096 714/6.2 |
| 2013/0073901 | A1 * | 3/2013 | Syrgabekov | H04L 63/08 714/6.24 |
| 2014/0040530 | A1 * | 2/2014 | Chen | G06F 11/1048 711/103 |
| 2014/0195640 | A1 * | 7/2014 | Kaiser | G06F 16/275 709/217 |
| 2015/0177999 | A1 * | 6/2015 | Gakhal | G06F 3/0608 709/213 |
| 2015/0288783 | A1 * | 10/2015 | Ma | H04L 67/36 715/708 |
| 2015/0324357 | A1 * | 11/2015 | Gakhal | H04L 67/1097 707/722 |
| 2015/0326452 | A1 * | 11/2015 | Bucher | H04L 67/36 709/224 |
| 2015/0326818 | A1 * | 11/2015 | Ma | H04N 21/21815 386/280 |
| 2015/0339187 | A1 * | 11/2015 | Sharon | G06F 11/1068 714/766 |
| 2016/0062689 | A1 * | 3/2016 | Cherubini | G06F 3/0643 711/159 |
| 2016/0070492 | A1 * | 3/2016 | Cherubini | G06F 3/068 711/114 |
| 2017/0286223 | A1 | 10/2017 | Baptist et al. | |
| 2018/0062764 | A1 | 3/2018 | Borrill | |
| 2018/0152516 | A1 | 5/2018 | Bestler et al. | |
| 2020/0117372 | A1 * | 4/2020 | Corey | G06F 3/067 |
| 2020/0210090 | A1 * | 7/2020 | Darisa | G06F 3/0689 |

* cited by examiner

REDUCING VULNERABILITY WINDOW IN KEY VALUE STORAGE SERVER WITHOUT SACRIFICING USABLE CAPACITY

CROSS-REFERENCE TO RELATED APPLICATION

This application claims priority under 35 U.S.C. § 119 to Provisional Patent Application Ser. No. 62/810,373, entitled "REDUCING VULNERABILITY WINDOW IN KEY VALUE STORAGE SERVER WITHOUT SACRIFICING USABLE CAPACITY" filed on Feb. 25, 2019. The subject matter of this earlier filed application is hereby incorporated by reference.

TECHNICAL FIELD

This description relates to data storage, and more specifically to reducing vulnerability window in a key-value storage server without sacrificing usable capacity.

BACKGROUND

The massive explosion of data has been well-documented. In some spaces the trend is towards disaggregated storage and compute architecture in order to improve cost efficiency and scale at finer granular. This may mean that compute machines store and access temporary data on storage machines over a network, as opposed to a collocated system. Disaggregated storage has many advantages over collocated storage where each node is constrained to the space of its local disks. In disaggregated storage, the system can draw from innumerable resources across the network.

In coding theory, an erasure code is a forward error correction (FEC) code under the assumption of bit erasures (rather than bit errors), which transforms a message of k symbols into a longer message (code word) with n symbols such that the original message can be recovered from a subset of then symbols. The fraction $r=k/n$ is called the code rate. The fraction $k'/k$, where $k'$ denotes the number of symbols required for recovery, is called reception efficiency. One form of erasure codes are maximum distance separable codes (MDS codes).

SUMMARY

According to one general aspect, a system may include a data interface circuit configured to receive data access requests, wherein each data access request is associated with a data set. The system may include a plurality of storage devices each storage device configured to store data, and wherein the plurality of storage devices has an amount of available storage space, an amount of used storage space, and an amount of redundant storage space. The system may include a data management circuit configured to: monitor the amount of available storage space in the in the plurality of storage devices, determine, for one or more data set, a level of redundancy to be associated with the respective data set, generate, for a first data set of the data sets, a redundant data portion to be associated with the first data set, and dynamically adjust the level of redundancy associated with the first data set, based, at least in part, upon the amount of available storage space.

According to another general aspect, an apparatus may include a plurality of storage devices each storage device configured to store data sets, and wherein the plurality of storage devices has an amount of available storage space, an amount of used storage space, and an amount of redundant storage space. The apparatus may include a data management circuit. The data management circuit may include a storage monitor circuit configured to measure the amount of available storage space in the in the plurality of storage devices. The data management circuit may include a redundancy allocator circuit configured to determine, for one or more data set, a level of redundancy to be associated with a first data set, and dynamically adjust the level of redundancy associated with the first data set based, at least in part, upon the amount of available storage space. The data management circuit may include at least one redundancy code generation circuit configured to create, for the first data set, a redundant data portion, if any, to be associated with the respective data set.

According to another general aspect, an apparatus may include a plurality of storage devices each storage device configured to store data sets, and wherein the plurality of storage devices has an amount of available storage space, an amount of used storage space, and an amount of redundant storage space, wherein the redundant storage space is associated with the used storage space. The apparatus may include a data management circuit configured to dynamic adjust a ratio of redundant storage space to used storage space based, at least in part, upon the amount of available storage space.

The details of one or more implementations are set forth in the accompanying drawings and the description below. Other features will be apparent from the description and drawings, and from the claims.

A system and/or method for data storage, and more specifically to reducing vulnerability window in a key-value storage server without sacrificing usable capacity, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
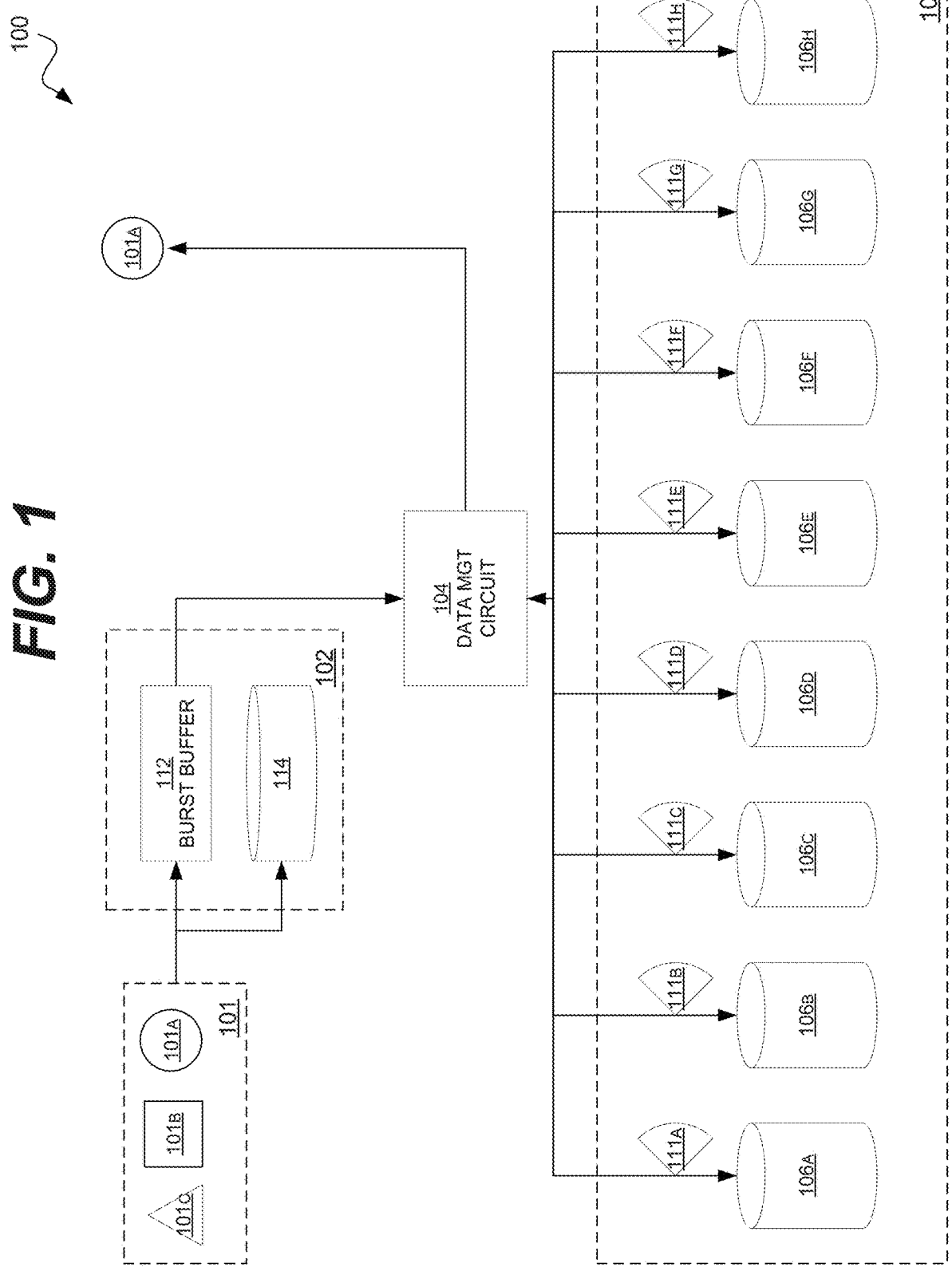
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 4:
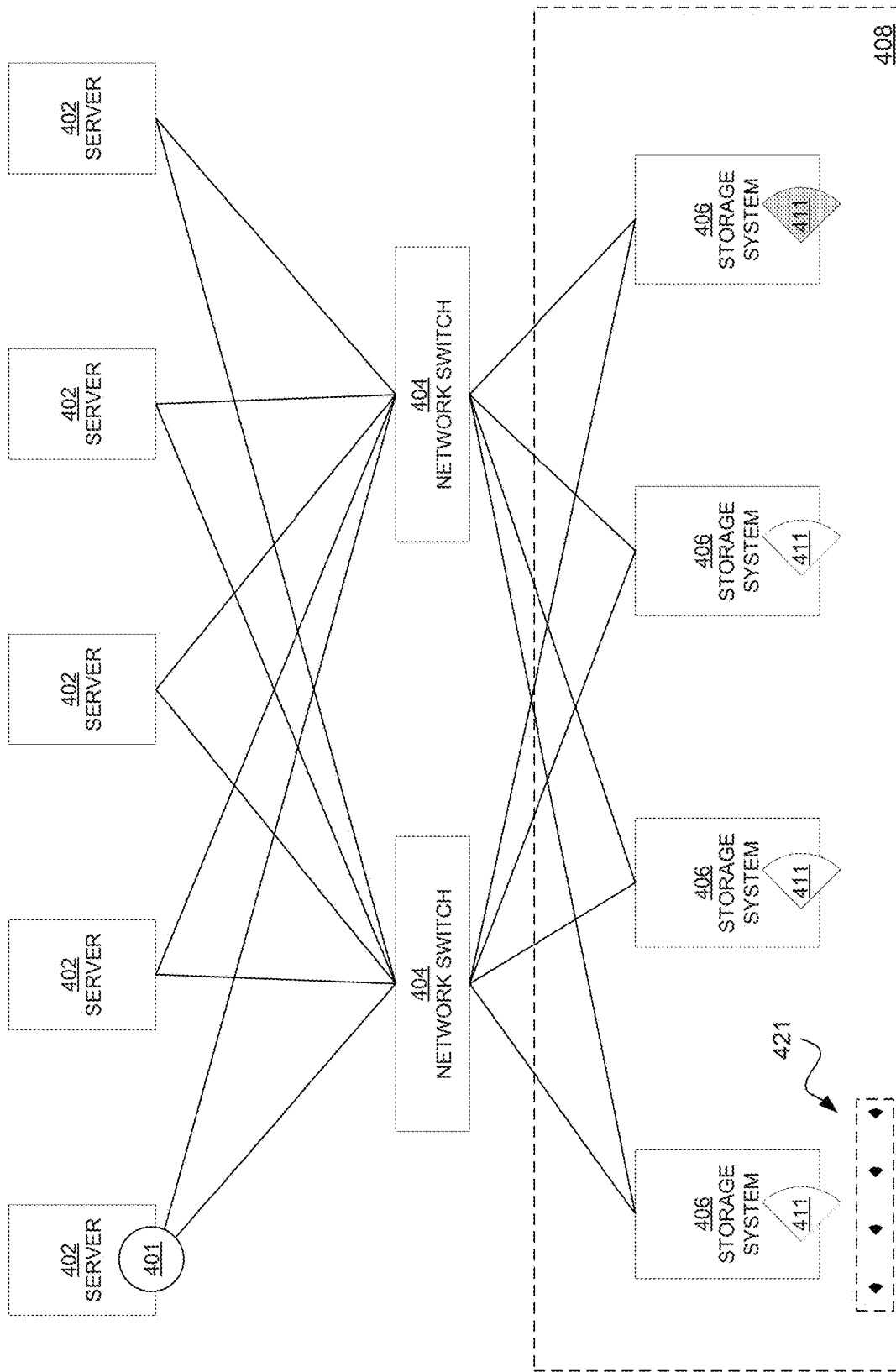
FIG. 4 is a block diagram of an example embodiment of a system in accordance with the disclosed subject matter.

FIG. 1 is a block diagram of an example embodiment of a system 100 it may include a portion of a disaggregated storage cluster (e.g., as shown in FIG. 4). In some embodiments, the system 100 may be employed to store data.

As described above, in various embodiments, dispersed, remote, or disaggregated systems may exist in which data is stored across multiple devices within a network. In such an embodiment, a host device (e.g., a server computer, a personal computer, a tablet, or other computing device or virtual machine) may request that data be stored in the disaggregated system (colloquially this may be referred to as "the Cloud" or some such marketing term). This disaggregated system may include one or more localized data storage clusters or nodes, such as system 100.

In the illustrated embodiment, the system 100 may include a plurality of storage devices 106. Each of these storage devices 106 may be configured to store data (e.g., data sets 101 and/or pieces of data 111). The storage devices 106 may be heterogeneous or homogeneous. They may include one or more of many different technologies, such as, for example, persistent memory devices, solid-state memory or devices (SSDs), magnetic memory (hard drives, or HDD), or optical memory. In various embodiments, the storage devices may be volatile or non-volatile. It is understood that the above are merely a few illustrative examples to which the disclosed subject matter is not limited.

In various embodiments, the system 100 may include or house many small form factors storage devices 106. These devices 106 may have a relatively high storage capability. Further, due to the law of probability and their large numbers (especially if many system 100s are used), the storage devices 106 may expect to suffer a non-trivial failure rate (e.g., <10%). The disclosed subject matter may address the effects of this failure rate, including an attempt to reduce the recovery period, reduce the processing overhead for rebuilding the data stored on the failed devices 106, minimize the amount of data movement required to rebuild or read form the devices 106, and enable a distributed processing of the rebuild operations. Further, in the illustrated embodiment, the system 100 may attempt to balance the amount of storage dedicated to data redundancy and space lost to this overhead.

In the illustrated embodiment, the system 100 may include a data interface circuit 102 configured to receive data accesses. In various embodiments, a data access may include a read (or Get) command, or a write (or Put) command. Each data access may be associated with a data set 101. In the illustrated embodiment, three data sets 101a, 101b, and 101c are shown. These data sets 101 may be (in the case of a write comment) provided by a requesting host system or server.

In the illustrated embodiment, the data interface circuit 102 may include a burst buffer memory 112. The burst buffer memory 112 may be configured to cache or temporarily store the incoming data sets 101, while they are operated on by the data management circuit 104. As described below, in various embodiments, the data sets 101 may be separated into smaller portions and associated with redundant data. This redundant data may allow the data sets to be reconstructed, if a storage device 106 fails.

Further, by immediately storing the data sets 101 in the burst buffer memory 112 the time or latency incurred by creating the redundant data may be hidden or effectively reduced. In another embodiment, if a data set 101 is stored in multiple devices 106 (e.g., mirrored), the time taken to write the data set 101 to multiple locations may be hidden from the larger disaggregated system. The burst buffer memory 112 may also allow multiple small data sets 101 to be combined into a larger more efficient data set.

In the illustrated embodiment, the data interface circuit 102 may include a write ahead log 114. In such an embodiment, the write ahead log 114 may record what operations are being performed by the system 100, such that, in the case of a failure within the system 100 the operations performed (and their success) may be determined. This may aid in the recovery of an operation after a failure occurs. The write ahead log 114 may be implemented with non-volatile dual in-line memory module (NVDIMM) using persistent memory or similar type of low-latency high bandwidth devices for very low latency or standard 106 devices.

In the illustrated embodiment, the system 100 may include a data management circuit 104. In such an embodiment, the data management circuit 104 may coordinate the plurality of storage device 106, such that they operate (to the external host server) as a single storage unit. This is despite that fact that various storage device 106 may fail and be replaced.

The data management circuit 104 and its functions will be described in relation to subsequent figures. For the immediate figure, the base functioning of the system will be described.

In the illustrated embodiment, the data management circuit 104 may break the data set 101 into a plurality of data pieces 111. Each of these data pieces 111 may be stored on individual storage devices 106. In such an embodiment, the data set 101 may be distributed across some or all of the plurality of storage device 106. For example, data piece 111A may be stored on storage device 106A, data piece 111B may be stored on storage device 106B, data piece 111C may be stored on storage device 106C, and so on until data piece 111H may be stored on storage device 106H. It is understood that the above is merely one illustrative example to which the disclosed subject matter is not limited. In various embodiments, these data pieces 111 may include one or more pieces of redundant data, as described below.

When a read or Get data access occurs, the data management circuit 104 may retrieve the data set 101 from the storage device 106. In various embodiments, this may include reassembling the data set 101 from the data pieces 111. The data set 101 may then be transmitted to the requesting device (e.g., a server) via the data interface circuit 102 or other interface circuit or port (not shown).

Figure 2:
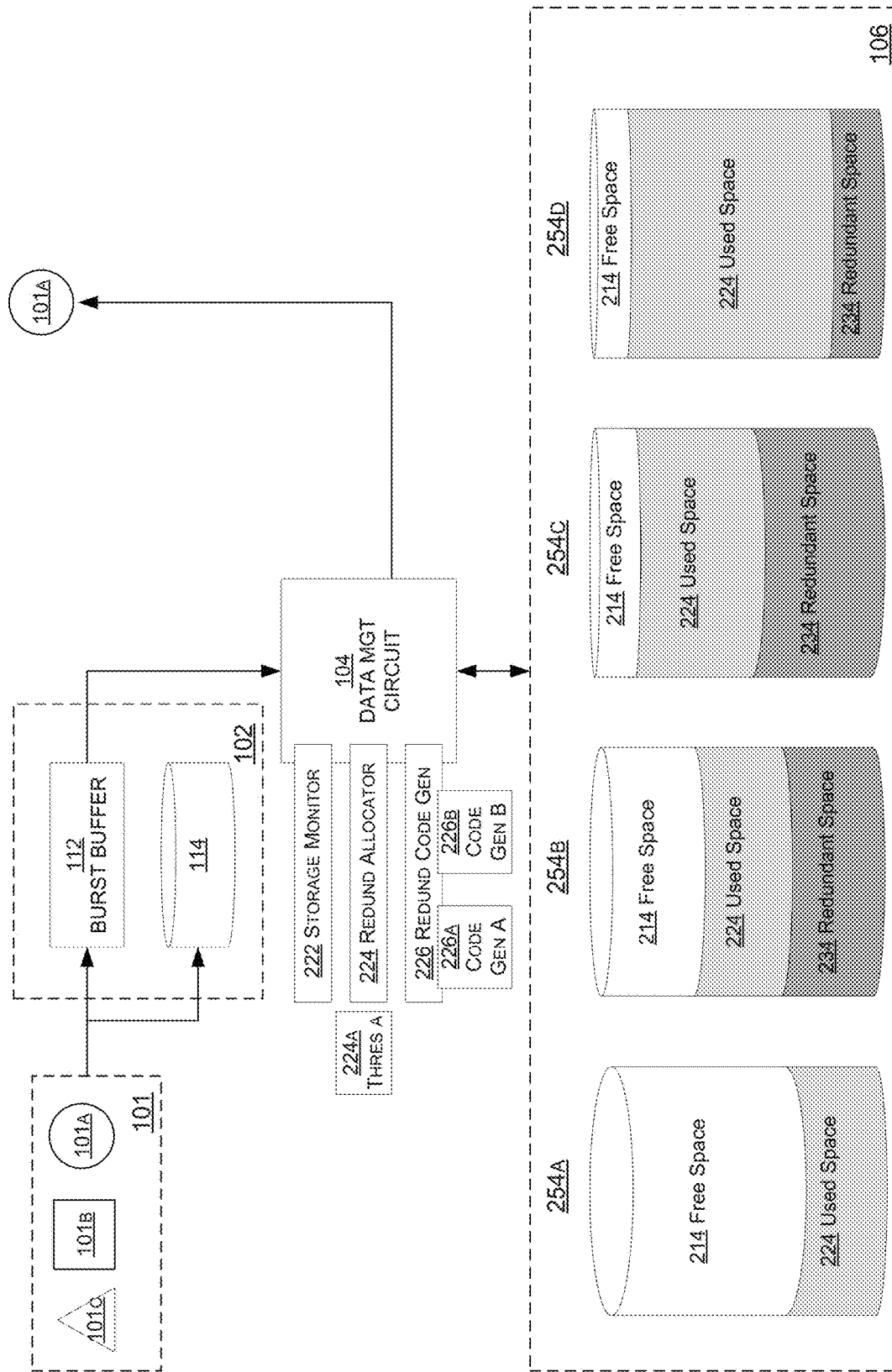
FIG. 2 is a block diagram of an example embodiment of a system in accordance with the disclosed subject matter.

FIG. 2 is a block diagram of an example embodiment of a system 100 in accordance with the disclosed subject matter. FIG. 2 shows a more conceptual illustration of the plurality of storage devices 106 and their management by the data management circuit 104.

In the illustrated embodiment, the storage provided by the plurality of storage devices 106 is shown as the storage 254. In the illustrated embodiment, four possible states of the storage 254 are shown. It is understood that the above are merely a few illustrative examples to which the disclosed subject matter is not limited.

In such an embodiment, the storage 254 (illustrated by state 254A) may include two portions or types of storage. Free storage 214 may be storage spaces where no data has been stored. Whereas used or user space 224 is the portion of the storage 254 where data is stored. As data sets 101 are written to the system 100 and storage 254, free space 214 may be converted into used space 224. As such the storage device 106 may include an amount of free space 214 and an amount of used space 224. The storage devices 106 may have such amounts both collectively (as the plurality) and individually.

In the illustrated embodiment, the data management circuit 104 may include a storage monitor circuit 222 configured to monitor the amounts of free space 214 and used space 224. In various embodiments, the storage monitor circuit 222 may both monitor how much of these the storage devices 106 has as a whole, and individually. In such an embodiment, knowing where free space 214 is may allow the data management circuit 104 to make choices about which particular storage device 106 will be used to store a given data set, or portion thereof.

As described above, failures of storage devices 106 are expected. Therefore, it may be prudent for the system 100 to make use of redundant storage techniques. These redundant storage techniques may include creating extra data pieces so that when (or if) parts of a data set go missing or are found to be in error, they whole data set may be reconstructed.

In the illustrated embodiment, state 254B shows a case that includes used space 224 and free space 214. As the used space 224 is less than the size of the free space 214, the data management circuit 104 may create redundant data (occupying the redundant space 234). In such an embodiment, each piece of data in the used space 224 may be associated with corresponding redundant data in the redundant space 234.

In one embodiment, example, each piece of user data (in the used space 224) may be associated with a corresponding piece of redundant data in the redundant space 234. In such an embodiment, the used space 224 may be mirrored, if there is sufficient un-used or free space 214 to do so.

In the illustrated embodiment, state 254C illustrates an example where the amount of used space 224 and redundant space 234 has grown, and the amount of free space 214 has shrunk or decreased. In such an embodiment, the amount of free space 214 may fall below a given threshold value (e.g., threshold 224*a*), and the data management circuit 104 may determine that an expansive or expensive redundancy scheme may no longer be desirable.

In the illustrated embodiment, the system 100 may include a data management circuit 104 with a redundancy allocation or allocator circuit 224. In such an embodiment, the redundancy allocation or allocator circuit 224 may be configured to determine a level of redundancy to be associated with a given data set or the storage 254.

In such an embodiment, as the storage 254 is relatively empty and has copious amounts of free space 214, the system 100 may employ an expensive or resilient redundancy scheme (e.g., mirroring). But, as the storage 254 fills up and the free space 214 decreases, the system 100 may start to employ a less expensive and less resilient redundancy scheme. For example, erasure or error encoding may be employed.

In the illustrated embodiment, state 254D shows an example where the amount of used space 224 and redundant space 234 are no longer equal. Instead the level of redundancy has been reduced. This reduction in the level of redundancy may decrease or simply reduce the rate of increase in the amount of redundant space 234. For example, in one embodiment, the ratio of used space 224 to redundant space 234 may be 8:1. Various redundancy schemes are discussed in reference to FIGS. 3*a*, 3*b*, and 3*c*. It is understood that the above is merely one illustrative example to which the disclosed subject matter is not limited.

In such an embodiment, the alteration of the current redundancy scheme and/or level may occur dynamically. No explicit act of user intervention may be required to alter the current redundancy scheme and/or level. Instead, the data management circuit 104 may detect that the amount of free space 214 has crossed a threshold value and, based upon a rule set, select a new redundancy level or scheme. In some embodiments, the same redundancy scheme (e.g., erasure encoding) may be maintained, but the number of redundant bits per byte of user data may be reduced. Likewise, the level of redundancy may be raised as the amount of free space 214 or other trigger event increases.

In the illustrated embodiment, the data management circuit 104 may include one or more redundancy code generation circuit(s) 226. In such an embodiment, the redundancy code generation circuit(s) 226 may be configured to generate any pieces of redundant data that are associated with each data set 101. In various embodiments, the redundancy code generation circuit(s) 226 may include different code generation circuits (e.g., circuits 226*a* & 226*b*) that are each specialized for particular code generation techniques.

In such an embodiment, the data set 101 may be initially and temporarily stored in the burst buffer memory 112. At this point, the system 100 may report the write or Put commend as successful, despite the data set 11 not being fully stored in the storage devices 106.

The data management circuit 104 may determine the level of redundancy to employ for this data set 101 and the encoding scheme to use. The redundancy code generation circuit(s) 226 may then read the data set 101 from the burst buffer memory 112, perform the selected redundancy operation, and write the individual data pieces (both user data and redundant data) into the individual storage devise 106. In such an embodiment, the latency required to compute the redundancy pieces of data and write them to the target storage devices 106 may be hidden from the host server that initiated the write or Put command.

In various embodiments, each data set 101 may be associated with a given level of redundancy. In another embodiment, the storage 254, as a whole, may be associated with a level of redundancy. In yet another embodiment, the data sets 101 may be grouped by characteristic (e.g., data type, quality-of-service, time of last access) and associated with levels of redundancy. It is understood that the above are merely a few illustrative examples to which the disclosed subject matter is not limited.

In various embodiments, the data management circuit 104 may delete pieces of redundant data to free up space. For example, some data sets 101 may be deemed to not need any redundancy, and their corresponding redundant data may be deleted. In various embodiments, this may occur when the amount of free space 214 has reached a given threshold level. In such an embodiment, the threshold level (like all threshold levels) may be programmable or configurable. In such an embodiment, these data sets may be unprotected, but may still be at least partially recoverable due to redundancy in other storage systems (like system 100) within a larger storage cluster (see FIG. 4).

In various embodiments, the data management circuit 104 may select which data sets to denude of their redundant bits based, at least in part, upon various characteristics. In some embodiments, the characteristics may include the size of the data set 101, the time of last access of the data set 101, frequency of use, the data type, a quality-of-service associated with the set 101, and so on. It is understood that the above are merely a few illustrative examples to which the disclosed subject matter is not limited.

When the system 100 starts to run out of capacity, data management circuit 104 may decide at a certain (adjustable) threshold when to start deleting redundant data to make more capacity available. This will allow the system 100 to store up to its full capacity.

In some embodiments, the system 100 may even delete user data, if the data management circuit 104 knows the user data can be reconstructed or is redundantly stored by another system within a storage cluster. In such an embodiment, the system 100 may be configured to communicate with other systems within a storage cluster.

In various embodiments, the data management circuit 104 may decide not to fully delete the redundant data associated with the data set, but to replace it with less resilient data. For example, if a first scheme uses 4 bits of redundant data for every 8 bits of user data, the redundancy level may be reduced to a scheme that uses 2 redundant bits for every 8 user data bits (freeing up 2 bits per 8 bits of user data). In such an embodiment, the system 100 may delete the old redundant data, before re-storing the user data using the new or second 2-bit scheme. It is understood that the above is merely one illustrative example to which the disclosed subject matter is not limited.

In various embodiments, these changes to previously stored user data and their redundancy levels may occur when the system 100 is otherwise ideal (e.g., no reads or writes are occurring). In such an embodiment, the processing and resources usage needed to change previously stored data may be hidden from any host servers or devices.

In various embodiments, the system 100 may include a processor (not shown), such as a controller or device processor. In such an embodiment, some or all of the operations described above may be executed by software, firmware, or a combination thereof.

Figure 3A:
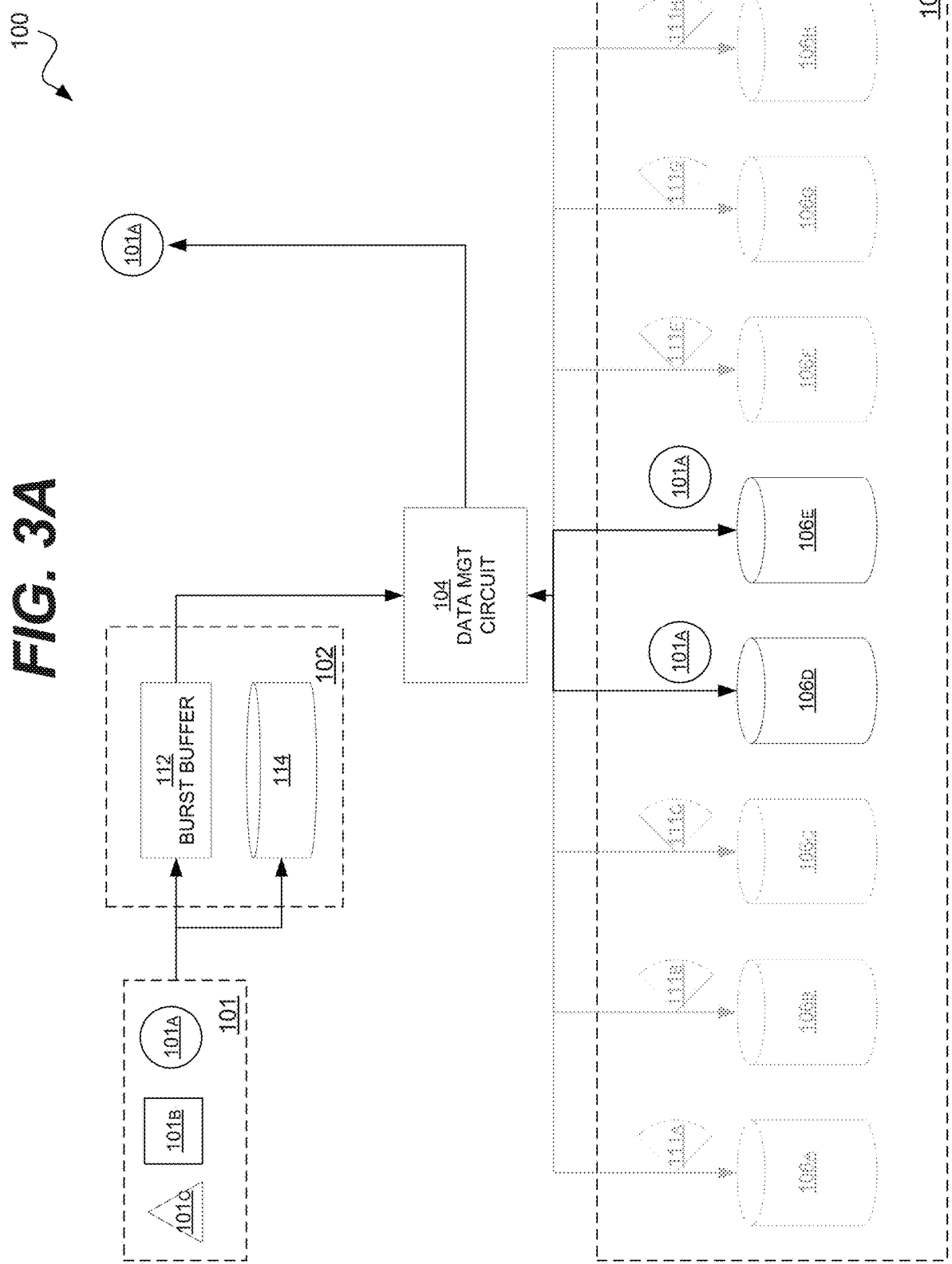
FIG. 3A is a block diagram of an example embodiment of a system in accordance with the disclosed subject matter.

FIG. 3A is a block diagram of an example embodiment of a system 100 in accordance with the disclosed subject matter. In the illustrated embodiment, an example redundancy scheme is employed. It is understood that the above is merely one illustrative example to which the disclosed subject matter is not limited.

In the illustrated embodiment, when sufficient capacity or free space is available (e.g., determined using a threshold), write or PUT operations may be mirrored. In the illustrated embodiment, each piece of data 101A may be mirrored to both storage devices 106D and 106E. Thus, when one of the two storage devices 106D & 106E fail, the system 100 will be able to retrieve the other copy of the data 101A. This may be done without needing to reconstruct the data or degrade performance. Likewise, multiple copies or mirrors of the data may be created.

In various embodiments, the mirrored data 101A may be distributed amongst the storage devices 106 using a rendezvous hash or similar technique. In the illustrated embodiment, it is seen that the data set 101 is stored to only two of the eight illustrated devices 106. Therefore, in various embodiments, not all storage devices 106 need to be employed to store a particular data set 101. The data pieces may be allocated to a sub-set of the devices 106, and the allocation may involve overlapping different data sets across different sub-sets.

In such an embodiment, the system 100's use of a distributed hash technique, may mean that capacity will continue to fill evenly across all devices 106 in the system 100. In such an embodiment, using a hash based method to do the mirroring (or storing) distributes the data across the available drives 106 and mitigates performance degradation. In various embodiments, this may also improve recovery time since all of the drives 106 in the system 100 may take part in any data set rebuilding process.

Figure 3B:
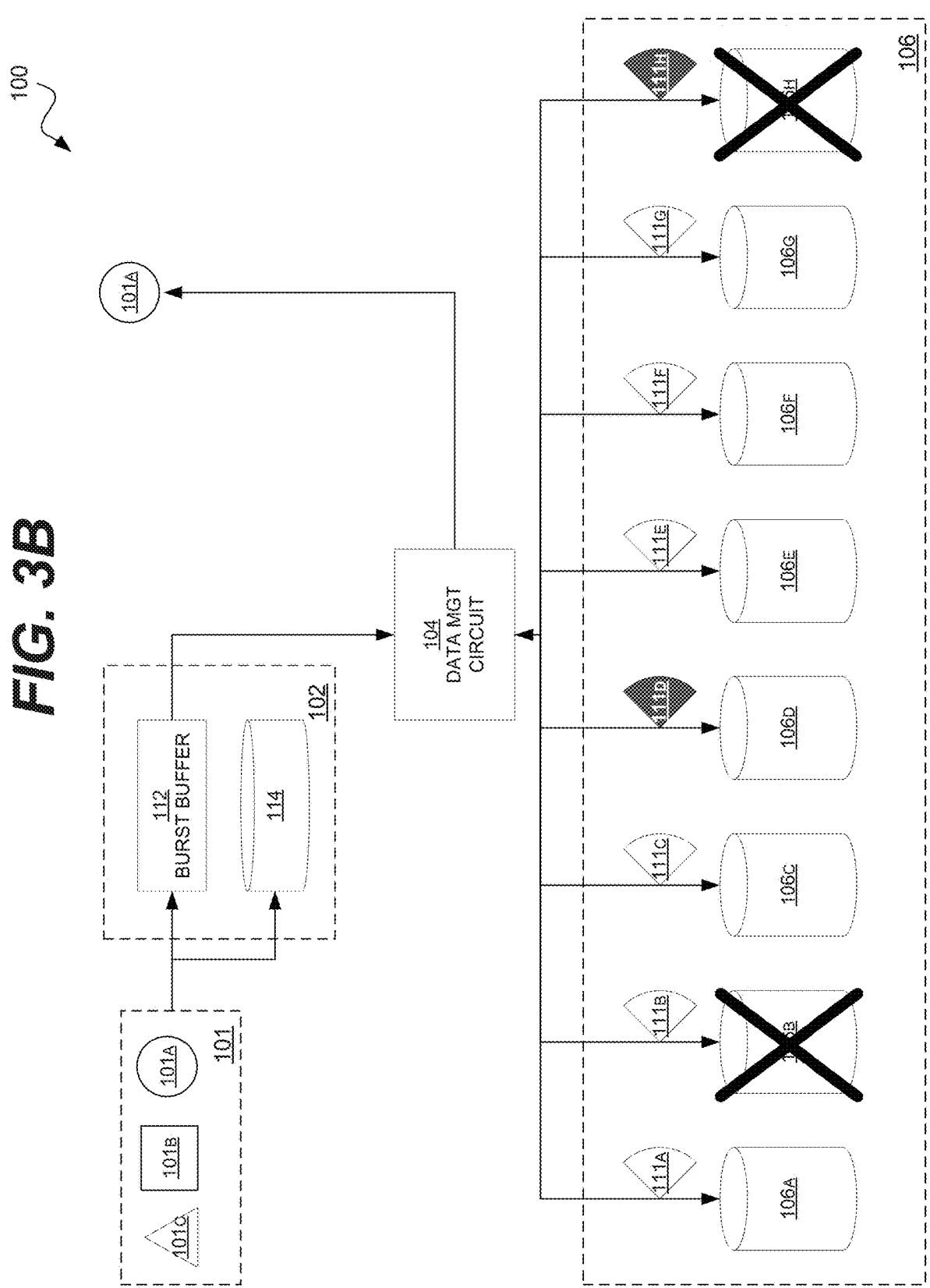
FIG. 3B is a block diagram of an example embodiment of a system in accordance with the disclosed subject matter.

FIG. 3B is a block diagram of an example embodiment of a system 100 in accordance with the disclosed subject matter. In the illustrated embodiment, a more complex example redundancy scheme is employed. It is understood that the above is merely one illustrative example to which the disclosed subject matter is not limited.

As described above, in another embodiment, the system 100 may employ a more complex redundancy encoding scheme (e.g., erasure encoding). In such an embodiment, parity bits or pieces of data may be created by the data management circuit 104, and associated with the data set 101.

In the illustrated embodiment, for every 6 bits of user data (data 111a, 111b, 111c, 111e, 111f, and 111g), 2-bits of redundancy data (data 111d, and 111h) are created and stored in the storage devices 106. In the illustrated embodiment, these pieces of data 111 are stored across multiple storage devices 106.

In such an embodiment, the system 100 will be able to loss or have fail up to two storage devices (e.g., devices 106b and 106h) and still be able to recreate the data set 101. In various embodiments, other forms of redundancy encoding may be employed.

Figure 3C:
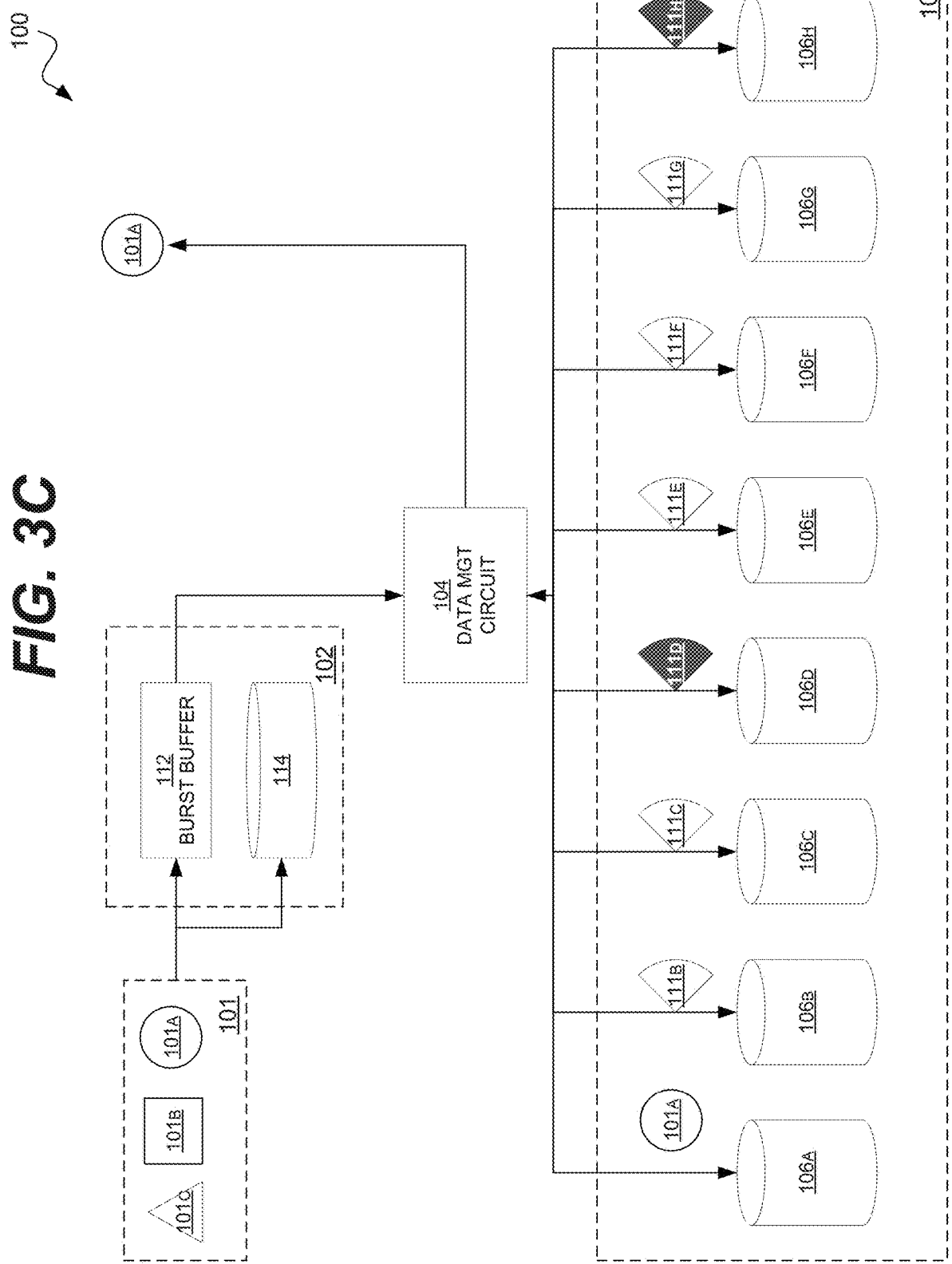
FIG. 3C is a block diagram of an example embodiment of a system in accordance with the disclosed subject matter.

FIG. 3C is a block diagram of an example embodiment of a system 100 in accordance with the disclosed subject matter. In the illustrated embodiment, a more complex example redundancy scheme is employed. It is understood that the above is merely one illustrative example to which the disclosed subject matter is not limited.

Another redundancy scheme to provide resiliency when disks fail in the system 100 may be to have a second copy of the data be erasure coded across a set of storage devices 106 (e.g., devices 106b, 106c, 106d, 106e, 106f, 106g, and 106h). And a first copy of the data set fully stored in a device 106A. In such an embodiment, the data set 101 may be stored in its hashed location in its original form (the first copy of device 106a), but the second copy will be erasure coded and distributed across the defined set of devices 106b-106h.

Such a scheme may allow the system 100 to support more than a single storage device 106 failure, while not incurring the latency delay needed to reassemble the data set 101 during a read/Get operation. In such an embodiment, when a read/Get operation occurs, instead of reassembling the data set from the erasure encoded copy (devices 106b-106h), the data set 101 may simply be read from the full copy (device 106a).

Depending upon the resiliency target or level, the number of user and redundancy bits or data pieces may be determined. Erasure coded data sets or copies might not overlap with the original data set (device 106A). In various embodiments, in which a key-value storage system is employed, this may be because the same data pieces use the same key, and each device must have only one version of that key on the individual device. Using rendezvous hashing and weights, the system 100 may be able to retrieve all data belonging to the erasure code set. Note that all data pieces may still be distributed across all the devices 106 in the system to maintain data and capacity distribution goals.

Similarly to the above, when the system 100 starts to run out of capacity, one copy of the data set may be deleted. In various embodiments, the erasure coded copy be deleted since reading multiple devices 106 for each read/GET operation may degrade performance.

Figure 3D:
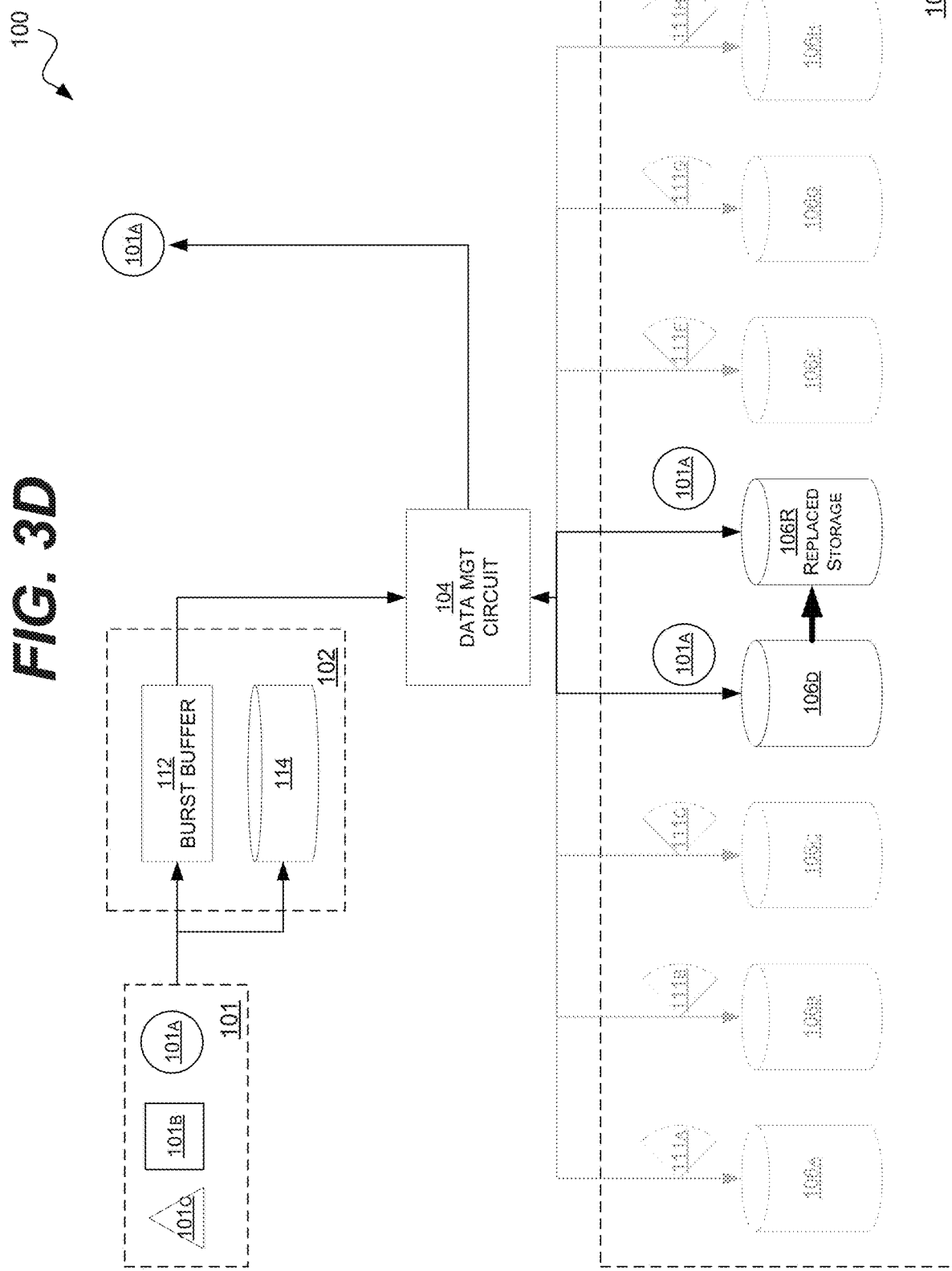
FIG. 3D is a block diagram of an example embodiment of a system in accordance with the disclosed subject matter.

FIG. 3D is a block diagram of an example embodiment of a system 100 in accordance with the disclosed subject matter. In the illustrated embodiment, the system 100 rebuilds lost data.

In the illustrated embodiment, the system 100 may have lost storage device 106E (shown in FIG. 3A). In such an embodiment, the storage device 106E may have been manually removed from the system 100. The storage device 106E may have suffered a hardware failure (e.g., broken wire, etc.). Or the system 100 may have lost the ability to communicate with the storage device 106E (e.g., an unplugged cable). It is understood that the above are merely a few illustrative examples to which the disclosed subject matter is not limited.

In the illustrated embodiment, the storage device 106R may have been added or activated within the system 100 to replace the failed device 106E. In some embodiments, the system 100 may employ a hot spare system. It is understood that the above are merely a few illustrative examples to which the disclosed subject matter is not limited.

In various embodiments, all data set rebuild operations may be handled by the individual system 100. Thus, larger clusters may have enabled distributed rebuild events where multiple devices 106 on different systems 100 may concurrently process rebuild operations.

In the illustrated embodiment, that involves a mirror redundancy scheme, a rebuild operation may include of copying the data set 101a from one of the mirrored devices 106 to the target or replaced device 106R Likewise, in other redundancy schemes (like erasure coding), rebuilding may include of both calculating the failed or missing data pieces by using both the original or user data and the redundant pieces of data.

In the illustrated embodiment, with mirroring, it is possible to lose one of the storage devices 106 and still be able to recover from the failure. In such an embodiment, the data set 101A may be copied from one device 106D to another 106R when the system 100 is ideal or has spare resources.

For example, the rebuilding may occur when no read/write operations are otherwise occurring to the system 100. Or, in another embodiment, if the system 100 can support multiple concurrent data access operations (e.g., 2 simultaneous operations), rebuilding may occur if only one data access operation is requested by a host server.

FIG. 4 is a block diagram of an example embodiment of a system 400 in accordance with the disclosed subject matter. The system 400 may include a plurality of devices or storage systems, as shown in FIG. 1.

As described above, the disclosed subject matter may be part of a larger disaggregated storage cluster architecture. Such a system 400 may employ a number of devices or sub-systems that are distributed over a larger geographic region or remotely deployed.

In such an embodiment, the system 400 may include a number or plurality of host servers 402 configured to read and write data to the system 400. These servers 402 may initiate the data access, read/write, Get/Put requests or operations described above.

In the illustrated embodiment, the system 400 may include one or more network switches 404. The network switch 404 may route these data accesses and their associated data sets between the storage system 406 and the host servers 402.

In the illustrated embodiment, the system 400 may include a plurality of storage systems 406. These storage systems 406 may be organized into storage clusters 408. In such an embodiment, these storage clusters 408 may act somewhat like storage devices 106 described above. The host servers 402 may store larger data sets 401 on the cluster 408, as a whole. The cluster 408 may then break those larger data sets 401 into smaller data sets 411 and store the portions of the larger data set 401 on each storage system 406. The larger data set 401 may be encoded at the cluster level with both user-data data sets (shown as white) and redundancy-data data sets (shown as grey), such that if a storage system 406 were to be removed from the system 400, the larger data set 401 may be recovered using the rest of the cluster 408. Likewise, these smaller, storage system 406-level data sets 411 may be stored in a redundant fashion on the storage system 400's storage device, as described above (pieces of data 421). In such an embodiment, multiple layers of redundancy may be employed.

The disclosed subject provides a technique and apparatus for temporal or "Best Effort" redundancy using, for example, Mirroring and/or Erasure Coding. This technique provides higher levels of performance and availability/reliability without sacrificing usable capacity, thus allowing significantly lower system cost. Further, in various embodiments, the disclosed subject matter is able to achieve high bandwidth and input/output operations per second (IOPS) performance both during normal operations as well as during progressive delete operations as the system's capacity fills up. The disclosed subject matter is able to evenly distribute data across all storage devices (e.g., SSDs) in the server system to achieve relatively high levels of usable capacity including redundancy data. This redundancy may be programmable or configurable depending upon the level of redundancy user desires and may be dynamically adjusted.

The disclosed subject matter also allows the ability to delete or remove redundant data that is least likely to be accessed and thus able to achieve increased performance. The disclosed subject matter is able to both maintain full usable capacity and better support for availability/reliability. The disclosed subject matter can sustain data availability when one or more storage devices fails. In response to a failure, the disclosed subject matter may automatically perform rebuild operations when failed drives are replaced and do so in a way that has minimal impact to performance.

As described above, in one embodiment, the disclosed subject matter may be employed to store data onto key-value (KV) SSDs with both redundancy and minimal impact to performance. In such an embodiment, the disclosed subject matter may be able to delete or remove data in a progressive manner to retain redundancy for longer duration as capacity fills up on the system. Rendezvous or highest random weight (HRW) hashing techniques may be used to distribute the data or more specifically (Key, Value) pairs evenly across the storage devices.

Figure 5:
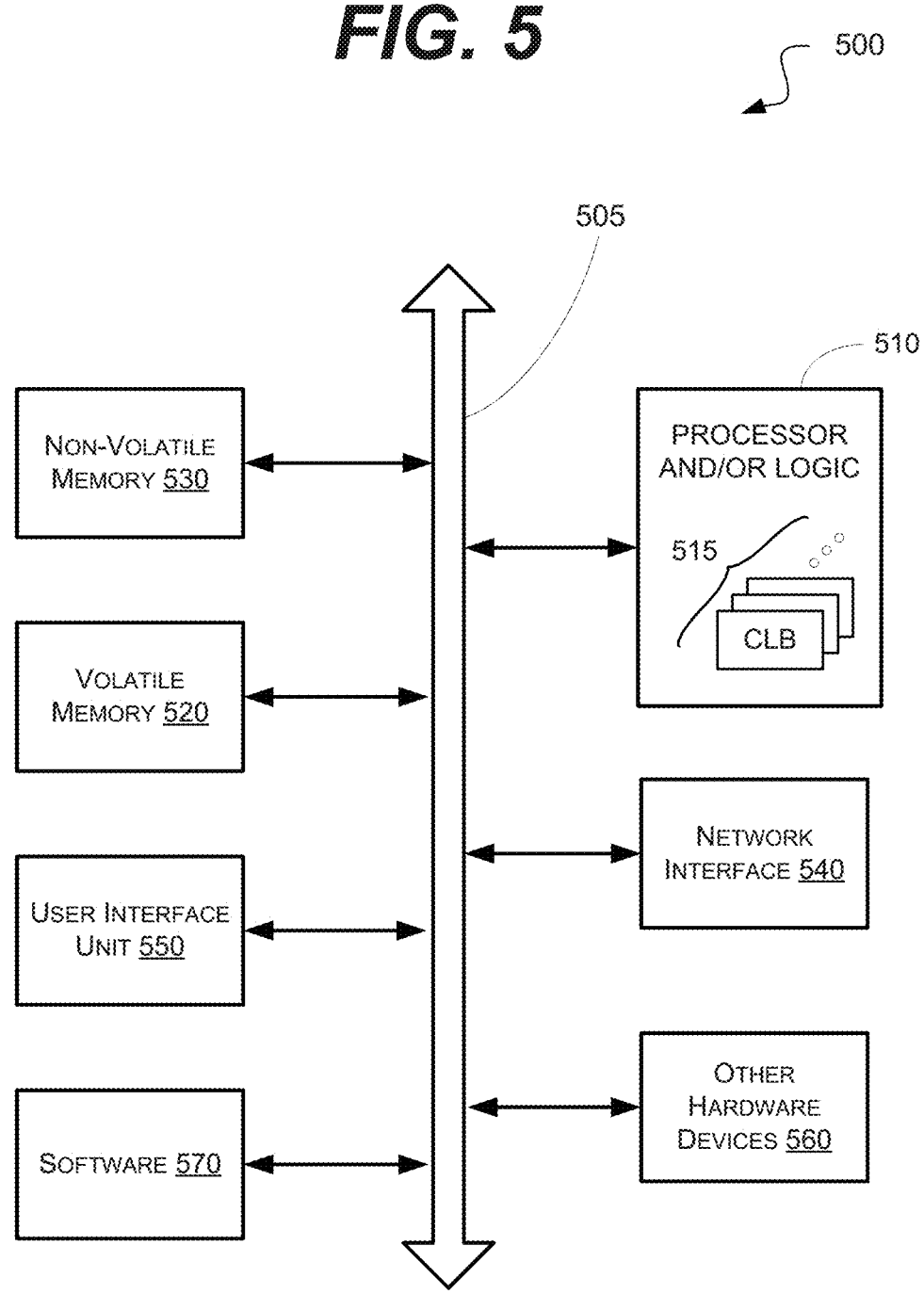
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM)). The information processing system 500 according to the disclosed subject matter may further include a non-volatile memory 530 (e.g., a hard drive, an optical memory, a NAND or Flash memory). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., Home-Plug, IEEE 1901). It is understood that the above are merely a few illustrative examples to which the disclosed subject matter is not limited.

The information processing system 500 according to the disclosed subject matter may further include a user interface unit 550 (e.g., a display adapter, a haptic interface, a human interface device). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540) of the information processing system 500. In such an embodiment, the information processing system 500 may include one or more native applications, which may be installed locally (e.g., within the non-volatile memory 530) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. A system comprising:
   a data interface circuit configured to receive a data access request associated with a data set;
   a storage device configured to store data, and wherein the storage device includes an amount of available storage space; and
   a data management circuit configured to:
   monitor the amount of available storage space in the storage device,
   determine, for the data set, a level of redundancy to associate with the data set,
   generate, for the data set, a redundant data portion associated with the data set, and dynamically adjust the level of redundancy associated with the data set, based, at least in part, upon the amount of available storage space, by reducing the level of redundancy associated with the data set by deleting one or more pieces of the redundant data portion and maintaining one or more pieces of the data set at a same location on the storage device.

2. The system, of claim 1, wherein the data management circuit is configured to:
employ one of at least two redundancy schemes to generate the redundant data portion; and
select a first one of the at least two redundancy schemes to employ to generate the redundant data portion, based at least in part, upon the amount of available storage space.

3. The system of claim 2, wherein the data management circuit is configured to:
employ the first one of the at least two redundancy schemes that includes data mirroring based on the available storage space being above a first threshold value.

4. The system of claim 1, wherein the data management circuit is configured to:
detect a failure of one or more pieces of data of a stored data set;
based on the failure detection, automatically rebuild the stored data set based, at least in part, upon the redundant data portion associated with the stored data set.

5. The system of claim 1, wherein the data interface circuit comprises:
a burst buffer memory circuit configured to temporarily store the data set and, at least partially, hide delays caused by the generation of the redundant data portion; and
a write ahead log.

6. The system of claim 1, wherein the data management circuit is configured to, based on a first piece of the redundant data portion associated with the data set being deleted:
generate a second piece of the redundant data portion to associate with the data set, wherein the second piece of the redundant data portion includes a lower level of redundancy than the first piece of the redundant data portion.

7. The system of claim 1, wherein the data management circuit comprises:
a specialized redundancy code creation circuit configured to generate a redundancy code based upon a data piece.

8. An apparatus comprising:
a storage device configured to store a data set, and having an amount of available storage space; and
a data management circuit comprising:
a storage monitor circuit configured to measure the amount of available storage space in the storage device,
a redundancy allocator circuit configured to determine, for the data set, a level of redundancy to be associated with the data set, and
at least one redundancy code generation circuit configured to create, for the data set, a redundant data portion associated with the data set,
wherein the redundancy allocator circuit is configured to dynamically adjust the level of redundancy associated with the data set, based, at least in part, upon the amount of available storage space, by reducing the level of redundancy associated with the data set by deleting one or more pieces of the redundant data portion and maintaining one or more pieces of the data set at a same location on the storage device.

9. The apparatus, of claim 8, wherein the redundancy allocator circuit is configured to:
select which a redundancy scheme to employ to generate the redundant data portion, based at least in part, upon the amount of available storage space.

10. The apparatus of claim 9, wherein the data management circuit is configured to:
employ a redundancy scheme that includes data mirroring based on the available storage space being above a first threshold value.

11. The apparatus of claim 8, wherein the data management circuit is configured to:
detect a failure of one or more stored pieces of data of the data set;
based on the failure detection, automatically rebuild the stored data set based, at least in part, upon a redundant data portion associated with the stored data set.

12. The apparatus of claim 8, further comprising:
a burst buffer memory circuit configured to temporarily store the data set received from a host server, and, at least partially, hide delays caused by the generation of the redundant data portion; and
a write ahead log.

13. The apparatus of claim 8, wherein the data management circuit is configured to, based on a first piece of the redundant data portion associated with the data set being deleted:
generate a second piece of the redundant data portion to be associated with the data set, wherein the second piece of the redundant data portion includes a lower level of redundancy than the first piece of the redundant data portion.

14. The apparatus of claim 8, wherein the data management circuit comprises:
a redundancy code generation circuit corresponding to a level of redundancy.

15. An apparatus comprising:
a storage device configured to store a data set, and having an amount of available storage space, an amount of used storage space, and an amount of redundant storage space, wherein the redundant storage space is associated with the used storage space; and
a data management circuit configured to dynamically adjust a ratio of redundant storage space to used storage space based, at least in part, upon the amount of available storage space, by reducing a level of redundancy associated with the data set by deleting one or more pieces of a redundant data portion associated with the data set and maintaining one or more pieces of the data set at a same location on the storage device.

16. The apparatus of claim 15, wherein the data management circuit is configured to:
generate the redundant data portion to associate with the data set, and
select a redundancy scheme to employ to generate the redundant data portion, based at least in part, upon the amount of available storage space.

17. The apparatus of claim 15, wherein the data management circuit is configured to:
detect a failure of one or more pieces of data of a stored data set; and
based on the failure detection, automatically rebuild the stored data set based, at least in part, upon the redundant data portion associated with the stored data set.

18. The apparatus of claim 15, wherein the one or more pieces of the redundant data portion comprise one or more first pieces of the redundant data portion, and the data management circuit is configured to:
- generate one or more second pieces of the redundant data portion to associate with the data set, wherein the one or more second pieces of the redundant data portion include a lower level of redundancy than the one or more first pieces of the redundant data portion, and
- replace the one or more first pieces of the redundant data portion with the one or more second pieces of the redundant data portion.

* * * * *